US011177913B2

(12) United States Patent
Zhu et al.

(10) Patent No.: US 11,177,913 B2
(45) Date of Patent: Nov. 16, 2021

(54) MAPPING DATA TO OFDM SYMBOLS

(71) Applicant: Motorola Mobility LLC, Chicago, IL (US)

(72) Inventors: Chenxi Zhu, Beijing (CN); Haipeng Lei, Beijing (CN); Tyler Brown, Lake Zurich, IL (US)

(73) Assignee: Motorola Mobility LLC, Chicago, IL (US)

( * ) Notice: Subject to any disclaimer, the term of this patent is extended or adjusted under 35 U.S.C. 154(b) by 112 days.

(21) Appl. No.: 16/497,108

(22) PCT Filed: Mar. 24, 2017

(86) PCT No.: PCT/CN2017/078148
§ 371 (c)(1),
(2) Date: Sep. 24, 2019

(87) PCT Pub. No.: WO2018/170908
PCT Pub. Date: Sep. 27, 2018

(65) Prior Publication Data
US 2020/0021405 A1  Jan. 16, 2020

(51) Int. Cl.
*H04L 5/00* (2006.01)
*H04L 1/00* (2006.01)
*H04L 27/26* (2006.01)

(52) U.S. Cl.
CPC .......... *H04L 5/0007* (2013.01); *H04L 1/0071* (2013.01); *H04L 5/0048* (2013.01); *H04L 27/2626* (2013.01)

(58) Field of Classification Search
CPC ......... H04L 1/00; H04L 27/26; H04L 1/0068; H04L 1/0071; H04L 27/2626; H04L 5/0044; H04L 5/0007; H04L 5/0048; H03M 13/2707
See application file for complete search history.

(56) References Cited

U.S. PATENT DOCUMENTS

2004/0151109 A1   8/2004  Batra et al.
2016/0028513 A1*  1/2016  Werner ................ H04L 5/0026
                                                       370/330

FOREIGN PATENT DOCUMENTS

| CN | 101223719 A | 7/2008 |
| CN | 101971551 A | 2/2011 |
| CN | 104796218 A | 7/2015 |

OTHER PUBLICATIONS

European Patent Office, "Extended European Search Report", dated Oct. 14, 2020, pp. 1-10.
LG Electronics, "On multiplexing between eMBB and URLLC", 3GPP TSG RAN WG1 Meeting #86bis R1-1609236, Oct. 10-14, 2016, pp. 1-12.

(Continued)

*Primary Examiner* — Kyaw Z Soe
(74) *Attorney, Agent, or Firm* — Kunzler Bean & Adamson

(57) ABSTRACT

Apparatuses, methods, and systems are disclosed for mapping data to OFDM symbols. One apparatus (200) includes a receiver (212) that receives (1402) data. In some embodiments, consecutive modulation symbols corresponding to the data are mapped to orthogonal frequency-division multiplexing symbols in a time domain that are separated by one or more orthogonal frequency-division multiplexing symbols.

16 Claims, 11 Drawing Sheets

(56) References Cited

OTHER PUBLICATIONS

PCT/CN2017/078148, International Search Report, dated Dec. 27, 2017.
PCT/CN2017/078148, Written Opinion of the International Searching Authority, dated Dec. 27, 2017.
Oualcomm Incorporated, "Frequency domain interleaving", 3GPP TSG RAN WG1 Meeting #88 R1-1702597, Feb. 13-17, 2017, pp. 1-5.
3GPP, "3rd Generation Partnership Project; Technical Specification Group Radio Access Network; Study on Scenarios and Requirements for Next Generation Access Technologies; (Release 15)", 3GPP TR 38.913 V15.0.0, Jun. 2018, pp. 1-39.
Ericsson, "On PDSCH and PUSCH to RE Mapping", 3GPP TSG-RAN WG1 #88 R1-1702670, Feb. 13-17, 2017, pp. 1-2.
3GPP, "3rd Generation Partnership Project; Technical Specification Group Radio Access Network; Evolved Universal Terrestrial Radio Access (E-UTRA); Physical channels and modulation (Release 15)", 3GPP TS 36.211 V15.2.0, Jun. 2018, pp. 1-236.

\* cited by examiner

500

600

700

800

900

| N/A | N/A | 4 | 6 | 0 | N/A | N/A | 7 | 1 | 3 | 5 | 2 | N/A | N/A |

| N/A | N/A | 0 | 3 | 6 | N/A | N/A | 1 | 4 | 7 | 2 | 5 | N/A | N/A |

| 0 | 4 | 8 | 12 | 1 | 5 | 9 | 13 | 2 | 6 | 10 | 3 | 7 | 11 |
|---|---|---|---|---|---|---|---|---|---|---|---|---|---|
| 14 | 18 | 22 | 26 | 15 | 19 | 23 | 27 | 16 | 20 | 24 | 17 | 21 | 25 |
| 28 | 32 | 36 | 40 | 29 | 33 | 37 | 41 | 30 | 34 | 38 | 31 | 35 | 39 |
| 42 | 46 | 50 | 54 | 43 | 47 | 51 | 55 | 44 | 48 | 52 | 45 | 49 | 53 |
| 56 | 60 | 64 | 68 | 57 | 61 | 65 | 69 | 58 | 62 | 66 | 59 | 63 | 67 |
| 70 | 74 | 78 | 82 | 71 | 75 | 79 | 83 | 72 | 76 | 80 | 73 | 77 | 81 |
| 84 | 88 | 92 | 96 | 85 | 89 | 93 | 97 | 86 | 90 | 94 | 87 | 91 | 95 |
| 98 | 102 | 106 | 110 | 99 | 103 | 107 | 111 | 100 | 104 | 108 | 101 | 105 | 109 |
| 112 | 116 | 120 | 124 | 113 | 117 | 121 | 125 | 114 | 118 | 122 | 115 | 119 | 123 |
| 126 | 130 | 134 | 138 | 127 | 131 | 135 | 139 | 128 | 132 | 136 | 129 | 133 | 137 |
| 140 | 144 | 148 | 152 | 141 | 145 | 149 | 153 | 142 | 146 | 150 | 143 | 147 | 151 |
| 154 | 158 | 162 | 166 | 155 | 159 | 163 | 167 | 156 | 160 | 164 | 157 | 161 | 165 |
| 168 | 172 | 176 | 180 | 169 | 173 | 177 | 181 | 170 | 174 | 178 | 171 | 175 | 179 |
| 182 | 186 | 190 | 194 | 183 | 187 | 191 | 195 | 184 | 188 | 192 | 185 | 189 | 193 |
| 196 | 200 | 204 | 208 | 197 | 201 | 205 | 209 | 198 | 202 | 206 | 199 | 203 | 207 |
| 210 | 214 | 218 | 222 | 211 | 215 | 219 | 223 | 212 | 216 | 220 | 213 | 217 | 221 |
| 224 | 228 | 232 | 236 | 225 | 229 | 233 | 237 | 226 | 230 | 234 | 227 | 231 | 235 |
| 238 | 242 | 246 | 250 | 239 | 243 | 247 | 251 | 240 | 244 | 248 | 241 | 245 | 249 |
| 252 | 256 | 260 | 264 | 253 | 257 | 261 | 265 | 254 | 258 | 262 | 255 | 259 | 263 |
| 266 | 270 | 274 | 278 | 267 | 271 | 275 | 279 | 268 | 272 | 276 | 269 | 273 | 277 |
| 280 | 284 | 288 | 292 | 281 | 285 | 289 | 293 | 282 | 286 | 290 | 283 | 287 | 291 |
| 294 | 298 | 302 | 306 | 295 | 299 | 303 | 307 | 296 | 300 | 304 | 297 | 301 | 305 |
| 308 | 312 | 316 | 320 | 309 | 313 | 317 | 321 | 310 | 314 | 318 | 311 | 315 | 319 |
| 322 | 326 | 330 | 334 | 323 | 327 | 331 | 335 | 324 | 328 | 332 | 325 | 329 | 333 |

FIG. 13

MAPPING DATA TO OFDM SYMBOLS

FIELD

The subject matter disclosed herein relates generally to wireless communications and more particularly relates to mapping data to OFDM symbols.

BACKGROUND

The following abbreviations are herewith defined, at least some of which are referred to within the following description: Third Generation Partnership Project ("3GPP"), Positive-Acknowledgment ("ACK"), Binary Phase Shift Keying ("BPSK"), Clear Channel Assessment ("CCA"), Cyclic Prefix ("CP"), Channel State Information ("CSI"), Common Search Space ("CSS"), Discrete Fourier Transform Spread ("DFTS"), Downlink Control Information ("DCI"), Downlink ("DL"), Downlink Pilot Time Slot ("DwPTS"), Enhanced Clear Channel Assessment ("eCCA"), Enhanced Mobile Broadband ("eMBB"), Evolved Node B ("eNB"), European Telecommunications Standards Institute ("ETSI"), Frame Based Equipment ("FBE"), Frequency Division Duplex ("FDD"), Frequency Division Multiple Access ("FDMA"), Guard Period ("GP"), Hybrid Automatic Repeat Request ("HARQ"), Internet-of-Things ("IoT"), Key Performance Indicators ("KPI"), Licensed Assisted Access ("LAA"), Load Based Equipment ("LBE"), Listen-Before-Talk ("LBT"), Long Term Evolution ("LTE"), Medium Access Control ("MAC"), Multiple Access ("MA"), Modulation Coding Scheme ("MCS"), Machine Type Communication ("MTC"), Massive MTC ("mMTC"), Multiple Input Multiple Output ("MIMO"), Multi User Shared Access ("MUSA"), Narrowband ("NB"), Negative-Acknowledgment ("NACK") or ("NAK"), Next Generation Node B ("gNB"), Non-Orthogonal Multiple Access ("NOMA"), Orthogonal Frequency Division Multiplexing ("OFDM"), Primary Cell ("PCell"), Physical Broadcast Channel ("PBCH"), Physical Downlink Control Channel ("PDCCH"), Physical Downlink Shared Channel ("PDSCH"), Pattern Division Multiple Access ("PDMA"), Physical Hybrid ARQ Indicator Channel ("PHICH"), Physical Random Access Channel ("PRACH"), Physical Resource Block ("PRB"), Physical Uplink Control Channel ("PUCCH"), Physical Uplink Shared Channel ("PUSCH"), Quality of Service ("QoS"), Quadrature Phase Shift Keying ("QPSK"), Radio Resource Control ("RRC"), Random Access Procedure ("RACH"), Random Access Response ("RAR"), Reference Signal ("RS"), Resource Spread Multiple Access ("RSMA"), Round Trip Time ("RTT"), Receive ("RX"), Sparse Code Multiple Access ("SCMA"), Scheduling Request ("SR"), Single Carrier Frequency Division Multiple Access ("SC-FDMA"), Secondary Cell ("SCell"), Shared Channel ("SCH"), Signal-to-Interference-Plus-Noise Ratio ("SINR"), System Information Block ("SIB"), Transport Block ("TB"), Transport Block Size ("TBS"), Time-Division Duplex ("TDD"), Time Division Multiplex ("TDM"), Transmission Time Interval ("TTI"), Transmit ("TX"), Uplink Control Information ("UCI"), User Entity/Equipment (Mobile Terminal) ("UE"), Uplink ("UL"), Universal Mobile Telecommunications System ("UMTS"), Uplink Pilot Time Slot ("UpPTS"), Ultra-reliability and Low-latency Communications ("URLLC"), and Worldwide Interoperability for Microwave Access ("WiMAX"). As used herein, "HARQ-ACK" may represent collectively the Positive Acknowledge ("ACK") and the Negative Acknowledge ("NAK"). ACK means that a TB is correctly received while NAK means a TB is erroneously received.

In certain wireless communications networks, a high carrier frequency (e.g., >6 GHz) may be used, such as millimeter wave. In such networks, diverse traffic types may be used in a common carrier with the traffic types having the same or different numerologies. For example, both an eMBB service and a URLLC service may be supported in the same carrier. As may be appreciated, different traffic types of traffic may have different KPI requirements (e.g., compared to eMBB, URLLC has a considerably shorter latency tolerance and ultra high transmission reliability). For example, one-way user plane latency for URLLC may be 0.5 ms for both UL and DL. In contrast, the criteria for one-way user plane latency for eMBB may be 4 ms for both UL and DL. To meet a requirement of transmission reliability, 32 bytes of URLLC traffic may have a transmission successful probability of $1 \times 10^{-5}$ within a duration of 1 ms. In contrast, a transmission successful probability for UL eMBB data transmission may be $1 \times 10^{-1}$. In certain networks, the stringent requirements for transmission reliability and low latency bring make a design of URLLC challenging.

In certain configurations, due to the stringent URLLC latency requirement, conventional SR triggered and scheduling-based UL transmission may not be fast enough to facilitate the URLLC traffic transmitted within the duration of 0.5 ms after the UL traffic is pushed to the buffer for transmission. Accordingly, for fast UL transmission, grant-free based UL transmission may be used for URLLC. Because a UE working in grant-free UL transmission mode may transmit UL data as soon as the UL traffic is pushed to the TX buffer, grant-free based URLLC transmission may satisfy the latency requirement in UL. Although resources may be reserved for UL grant free URLLC transmission (e.g., orthogonal to eMBB resources), various factors (e.g., feasibility, economics, etc.) may inhibit transmitting them in dedicated resources. Therefore, in various configurations, multiplexing eMBB and URLLC in the same resources may be performed.

In the frequency domain of various network configurations, resources may be allocated for transmission in the unit of PRB, which consists of 12 adjacent subcarriers (e.g., of a selected numerology in which subcarrier spacing may be $2^k \times 15$ kHz and k may be 0, 1, 2, 3, or 4). For URLLC, because transmission delay is less than other types of traffic, a different numerology may be used to reduce the transmission symbol length. In the time domain, a transmission may occupy a slot (e.g., 7 or 14 symbols) or a mini-slot. The length of a mini-slot may be as short as 1 symbol or longer (but shorter than that of a slot). The mini-slot may be used to reduce delay of URLLC transmission. The beginning position of a mini-slot may not be limited to coincide with that of a slot. For example, a mini-slot slot may start from any symbol in a slot. In various configurations, a grant-free transmission of UL URLLC in a mini-slot may cause unpredictable interference to scheduling based eMBB traffic transmitted in a regular slot.

In downlink of some network configurations, both eMBB and URLLC packets are transmitted by a gNB. The gNB may avoid transmitting both eMBB and URLLC in the same resources. However, in one example, an eMBB packet may be transmitted to a first UE in a slot. The transmission to the first UE may be based on a schedule made by the gNB and a corresponding DCI is transmitted in the beginning of the slot (or before the beginning of the PDSCH-carrying slot, as agreed in the SI phase). While the first UE is receiving (or expecting to receive) the eMBB packet based on its received DCI, the gNB may receive a DL URLLC packet for a second UE. Given the urgency of URLLC, the gNB may start a mini-slot in the middle of the eMBB slot to transmit the URLLC packet to the second UE. Accordingly, the gNB may stops transmission to the first UE during the mini-slot. The mini-slot may be self-contained (e.g., it may carry DCI to the second UE). From the second UE's point of view, there may be no ambiguity as to in which resource to receive the URLLC packet. There is also no interference from the eMBB packet to the URLLC packet. However, from the first UE's point of view, the first UE is receiving its eMBB packet punctured by the URLLC packet without knowing it, therefore the first UE may suffer from the interference of the URLLC packet.

BRIEF SUMMARY

Apparatuses for mapping data to OFDM symbols are disclosed. Methods and systems also perform the functions of the apparatus. In one embodiment, the apparatus includes a receiver that receives data. In some embodiments, consecutive modulation symbols corresponding to the data are mapped to orthogonal frequency-division multiplexing symbols in a time domain that are separated by one or more orthogonal frequency-division multiplexing symbols.

In one embodiment, modulation symbols corresponding to the data are mapped to orthogonal frequency-division multiplexing symbols in a frequency domain. In certain embodiments, spatial layers of a resource element are not mapped to consecutive modulation symbols corresponding to the data. In various embodiments, consecutive modulation symbols corresponding to the data are mapped to orthogonal frequency-division multiplexing symbols in the time domain that are separated by two or more orthogonal frequency-division multiplexing symbols. In some embodiments, consecutive modulation symbols corresponding to the data are mapped to orthogonal frequency-division multiplexing symbols in the time domain that are separated by three or more orthogonal frequency-division multiplexing symbols.

A method for mapping data to OFDM symbols, in one embodiment, includes receiving data. In various embodiments, consecutive modulation symbols corresponding to the data are mapped to orthogonal frequency-division multiplexing symbols in a time domain that are separated by one or more orthogonal frequency-division multiplexing symbols.

One apparatuses for mapping data to OFDM symbols includes a transmitter that transmits data. In certain embodiments, consecutive modulation symbols corresponding to the data are mapped to orthogonal frequency-division multiplexing symbols in a time domain that are separated by one or more orthogonal frequency-division multiplexing symbols.

In one embodiment, modulation symbols corresponding to the data are mapped to orthogonal frequency-division multiplexing symbols in a frequency domain. In certain embodiments, spatial layers of a resource element are not mapped to consecutive modulation symbols corresponding to the data. In various embodiments, consecutive modulation symbols corresponding to the data are mapped to orthogonal frequency-division multiplexing symbols in the time domain that are separated by two or more orthogonal frequency-division multiplexing symbols. In some embodiments, consecutive modulation symbols corresponding to the data are mapped to orthogonal frequency-division multiplexing symbols in the time domain that are separated by three or more orthogonal frequency-division multiplexing symbols.

A method for mapping data to OFDM symbols, in one embodiment, includes transmitting data. In various embodiments, consecutive modulation symbols corresponding to the data are mapped to orthogonal frequency-division multiplexing symbols in a time domain that are separated by one or more orthogonal frequency-division multiplexing symbols.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 9 is a diagram illustrating one embodiment of mapping data;

FIG. 10 is a diagram illustrating another embodiment of mapping data;

FIG. 13 is a diagram illustrating yet another embodiment of interleaving data;

DETAILED DESCRIPTION

Figure 1:
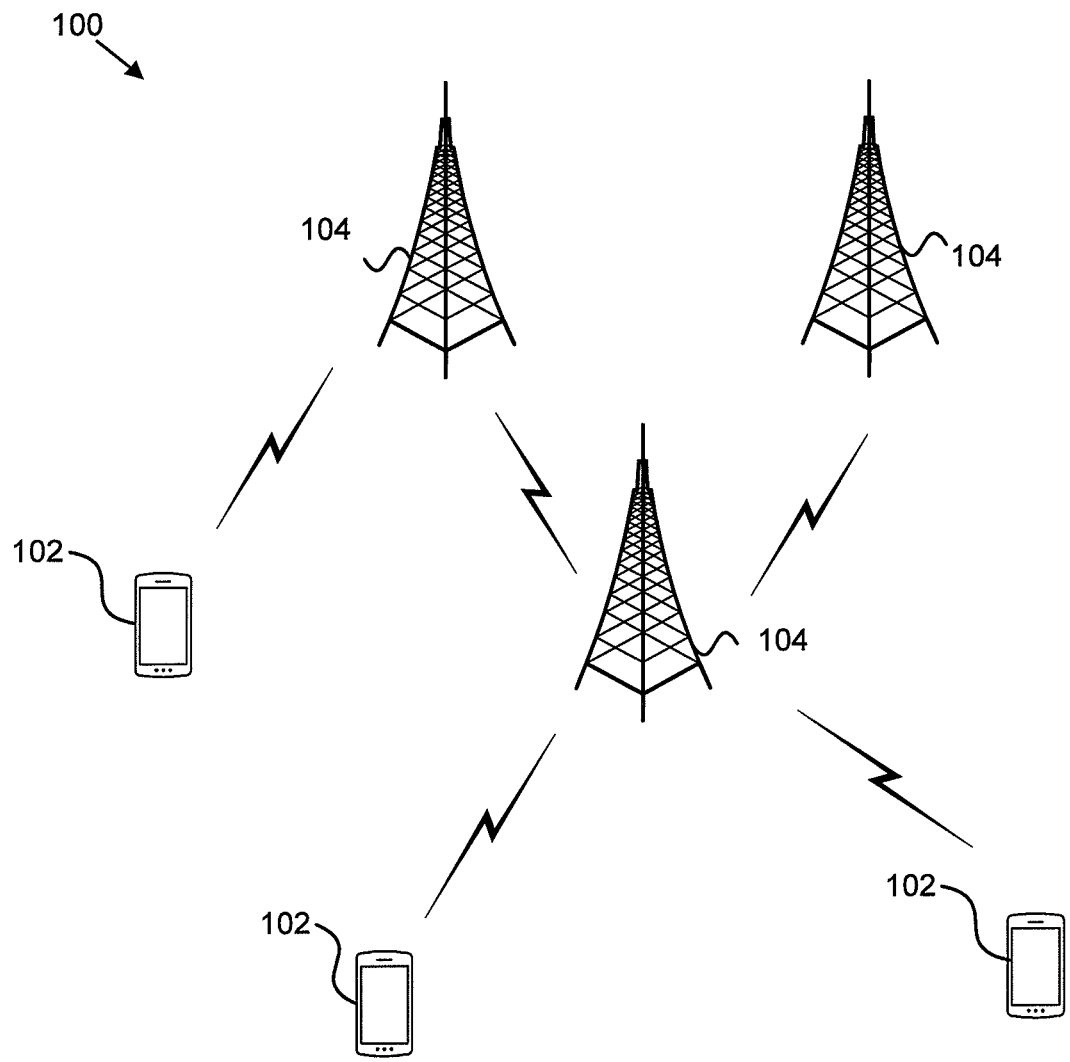
FIG. 1 is a schematic block diagram illustrating one embodiment of a wireless communication system for mapping data to OFDM symbols.

As will be appreciated by one skilled in the art, aspects of the embodiments may be embodied as a system, apparatus, method, or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Certain of the functional units described in this specification may be labeled as modules, in order to more particularly emphasize their implementation independence. For example, a module may be implemented as a hardware circuit comprising custom very-large-scale integration ("VLSI") circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, include one or more physical or logical blocks of executable code which may, for instance, be organized as an object, procedure, or function. Nevertheless, the executables of an identified module need not be physically located together, but may include disparate instructions stored in different locations which, when joined logically together, include the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory ("RAM"), a read-only memory ("ROM"), an erasable programmable read-only memory ("EPROM" or Flash memory), a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be any number of lines and may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. The code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which includes one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 depicts an embodiment of a wireless communication system 100 for mapping data to OFDM symbols. In one embodiment, the wireless communication system 100 includes remote units 102 and base units 104. Even though a specific number of remote units 102 and base units 104 are depicted in FIG. 1, one of skill in the art will recognize that any number of remote units 102 and base units 104 may be included in the wireless communication system 100.

In one embodiment, the remote units 102 may include computing devices, such as desktop computers, laptop computers, personal digital assistants ("PDAs"), tablet computers, smart phones, smart televisions (e.g., televisions connected to the Internet), set-top boxes, game consoles, security systems (including security cameras), vehicle on-board computers, network devices (e.g., routers, switches, modems), or the like. In some embodiments, the remote units 102 include wearable devices, such as smart watches, fitness bands, optical head-mounted displays, or the like. Moreover, the remote units 102 may be referred to as subscriber units, mobiles, mobile stations, users, terminals, mobile terminals, fixed terminals, subscriber stations, UE, user terminals, a device, or by other terminology used in the art. The remote units 102 may communicate directly with one or more of the base units 104 via UL communication signals.

The base units 104 may be distributed over a geographic region. In certain embodiments, a base unit 104 may also be referred to as an access point, an access terminal, a base, a base station, a Node-B, an eNB, a gNB, a Home Node-B, a relay node, a device, or by any other terminology used in the art. The base units 104 are generally part of a radio access network that includes one or more controllers communicably coupled to one or more corresponding base units 104. The radio access network is generally communicably coupled to one or more core networks, which may be coupled to other networks, like the Internet and public switched telephone networks, among other networks. These and other elements of radio access and core networks are not illustrated but are well known generally by those having ordinary skill in the art.

In one implementation, the wireless communication system 100 is compliant with the 3GPP protocol, wherein the base unit 104 transmits using an OFDM modulation scheme on the DL and the remote units 102 transmit on the UL using a SC-FDMA scheme or an OFDM scheme. More generally, however, the wireless communication system 100 may implement some other open or proprietary communication protocol, for example, WiMAX, among other protocols. The present disclosure is not intended to be limited to the implementation of any particular wireless communication system architecture or protocol.

The base units 104 may serve a number of remote units 102 within a serving area, for example, a cell or a cell sector via a wireless communication link. The base units 104 transmit DL communication signals to serve the remote units 102 in the time, frequency, and/or spatial domain.

In one embodiment, a base unit 104 may transmit data to a remote unit 102. In such an embodiment, consecutive modulation symbols corresponding to the data are mapped to orthogonal frequency-division multiplexing symbols in a time domain that are separated by one or more orthogonal frequency-division multiplexing symbols. Accordingly, a base unit 104 may be used for mapping data to OFDM symbols.

In another embodiment, a remote unit 102 may receive data. In various embodiments, consecutive modulation symbols corresponding to the data are mapped to orthogonal frequency-division multiplexing symbols in a time domain that are separated by one or more orthogonal frequency-division multiplexing symbols. Accordingly, a remote unit 102 may be used for mapping data to OFDM symbols.

Figure 2:
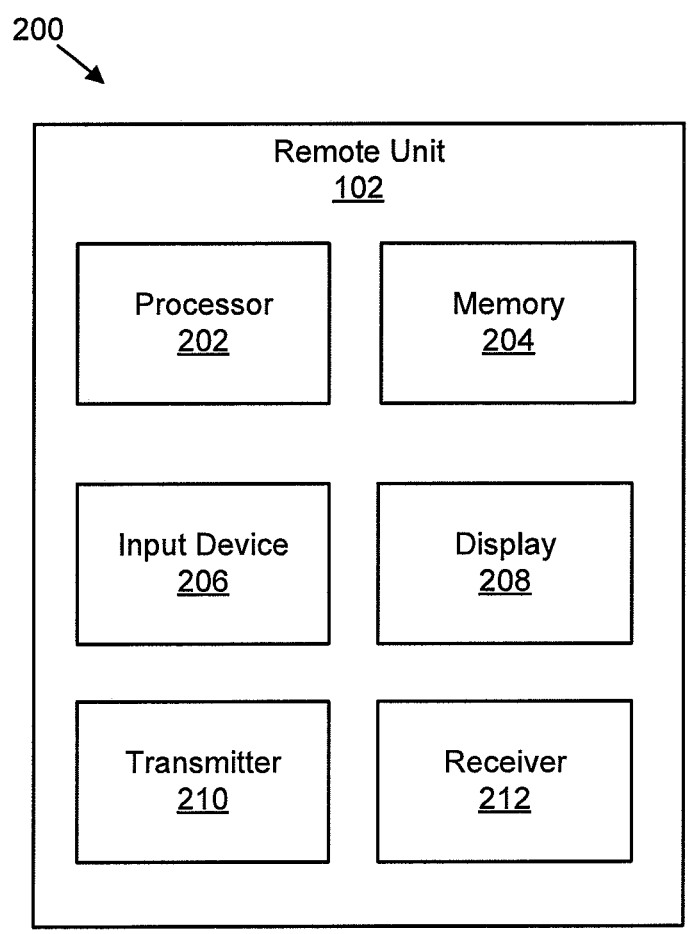
FIG. 2 is a schematic block diagram illustrating one embodiment of an apparatus that may be used for mapping data to OFDM symbols.

FIG. 2 depicts one embodiment of an apparatus 200 that may be used for mapping data to OFDM symbols. The apparatus 200 includes one embodiment of the remote unit 102. Furthermore, the remote unit 102 may include a processor 202, a memory 204, an input device 206, a display 208, a transmitter 210, and a receiver 212. In some embodiments, the input device 206 and the display 208 are combined into a single device, such as a touchscreen. In certain embodiments, the remote unit 102 may not include any input device 206 and/or display 208. In various embodiments, the remote unit 102 may include one or more of the processor 202, the memory 204, the transmitter 210, and the receiver 212, and may not include the input device 206 and/or the display 208.

The processor 202, in one embodiment, may include any known controller capable of executing computer-readable instructions and/or capable of performing logical operations. For example, the processor 202 may be a microcontroller, a microprocessor, a central processing unit ("CPU"), a graphics processing unit ("GPU"), an auxiliary processing unit, a field programmable gate array ("FPGA"), or similar programmable controller. In some embodiments, the processor 202 executes instructions stored in the memory 204 to perform the methods and routines described herein. In various embodiments, the processor 202 demodulates data. The processor 202 is communicatively coupled to the memory 204, the input device 206, the display 208, the transmitter 210, and the receiver 212.

The memory 204, in one embodiment, is a computer readable storage medium. In some embodiments, the memory 204 includes volatile computer storage media. For example, the memory 204 may include a RAM, including dynamic RAM ("DRAM"), synchronous dynamic RAM ("SDRAM"), and/or static RAM ("SRAM"). In some embodiments, the memory 204 includes non-volatile computer storage media. For example, the memory 204 may include a hard disk drive, a flash memory, or any other suitable non-volatile computer storage device. In some embodiments, the memory 204 includes both volatile and non-volatile computer storage media. In some embodiments, the memory 204 stores data relating to mapping data. In some embodiments, the memory 204 also stores program code and related data, such as an operating system or other controller algorithms operating on the remote unit 102.

The input device 206, in one embodiment, may include any known computer input device including a touch panel, a button, a keyboard, a stylus, a microphone, or the like. In some embodiments, the input device 206 may be integrated with the display 208, for example, as a touchscreen or similar touch-sensitive display. In some embodiments, the input device 206 includes a touchscreen such that text may be input using a virtual keyboard displayed on the touchscreen and/or by handwriting on the touchscreen. In some embodiments, the input device 206 includes two or more different devices, such as a keyboard and a touch panel.

The display 208, in one embodiment, may include any known electronically controllable display or display device. The display 208 may be designed to output visual, audible, and/or haptic signals. In some embodiments, the display 208 includes an electronic display capable of outputting visual data to a user. For example, the display 208 may include, but is not limited to, an LCD display, an LED display, an OLED display, a projector, or similar display device capable of outputting images, text, or the like to a user. As another, non-limiting, example, the display 208 may include a wearable display such as a smart watch, smart glasses, a heads-up display, or the like. Further, the display 208 may be a component of a smart phone, a personal digital assistant, a television, a table computer, a notebook (laptop) computer, a personal computer, a vehicle dashboard, or the like.

In certain embodiments, the display 208 includes one or more speakers for producing sound. For example, the display 208 may produce an audible alert or notification (e.g., a beep or chime). In some embodiments, the display 208 includes one or more haptic devices for producing vibrations, motion, or other haptic feedback. In some embodiments, all or portions of the display 208 may be integrated with the input device 206. For example, the input device 206 and display 208 may form a touchscreen or similar touch-sensitive display. In other embodiments, the display 208 may be located near the input device 206.

The transmitter 210 is used to provide UL communication signals to the base unit 104 and the receiver 212 is used to receive DL communication signals from the base unit 104. In some embodiments, the receiver 212 receives data. In certain embodiments, consecutive modulation symbols corresponding to the data are mapped to orthogonal frequency-division multiplexing symbols in a time domain that are separated by one or more orthogonal frequency-division multiplexing symbols. Although only one transmitter 210 and one receiver 212 are illustrated, the remote unit 102 may have any suitable number of transmitters 210 and receivers 212. The transmitter 210 and the receiver 212 may be any suitable type of transmitters and receivers. In one embodiment, the transmitter 210 and the receiver 212 may be part of a transceiver.

Figure 3:
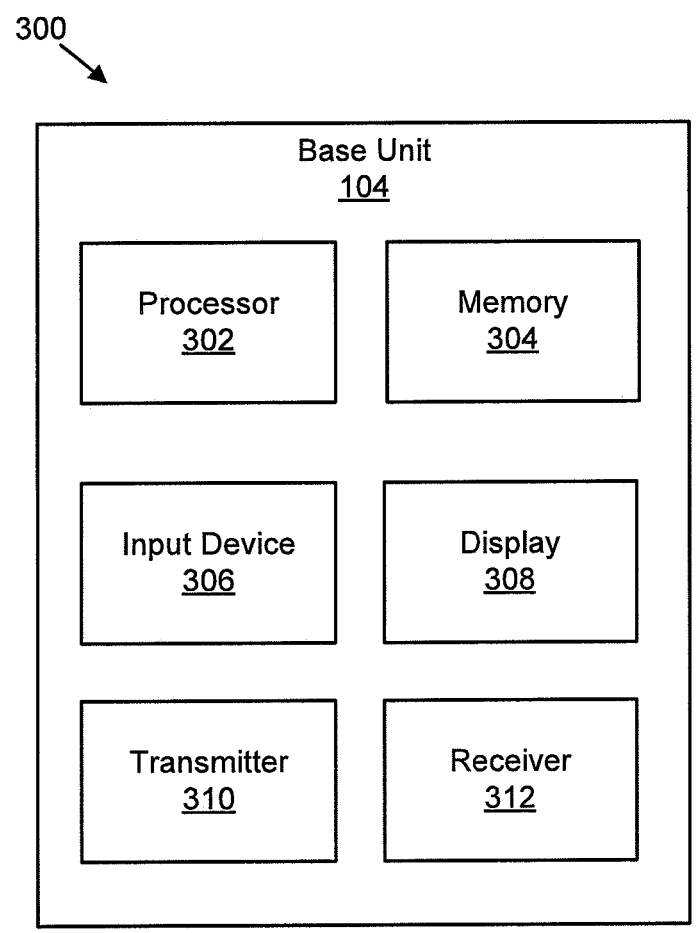
FIG. 3 is a schematic block diagram illustrating one embodiment of an apparatus that may be used for mapping data to OFDM symbols.

FIG. 3 depicts one embodiment of an apparatus 300 that may be used for mapping data to OFDM symbols. The apparatus 300 includes one embodiment of the base unit 104. Furthermore, the base unit 104 may include a processor 302, a memory 304, an input device 306, a display 308, a transmitter 310, and a receiver 312. As may be appreciated, the processor 302, the memory 304, the input device 306, the display 308, the transmitter 310, and the receiver 312 may be substantially similar to the processor 202, the memory 204, the input device 206, the display 208, the transmitter 210, and the receiver 212 of the remote unit 102, respectively.

In various embodiments, the transmitter 310 is used to transmit data. In such embodiments, consecutive modulation symbols corresponding to the data are mapped to orthogonal frequency-division multiplexing symbols in a time domain that are separated by one or more orthogonal frequency-division multiplexing symbols. Although only one transmitter 310 and one receiver 312 are illustrated, the base unit 104 may have any suitable number of transmitters 310 and receivers 312. The transmitter 310 and the receiver 312 may be any suitable type of transmitters and receivers. In one embodiment, the transmitter 310 and the receiver 312 may be part of a transceiver.

Figure 4:
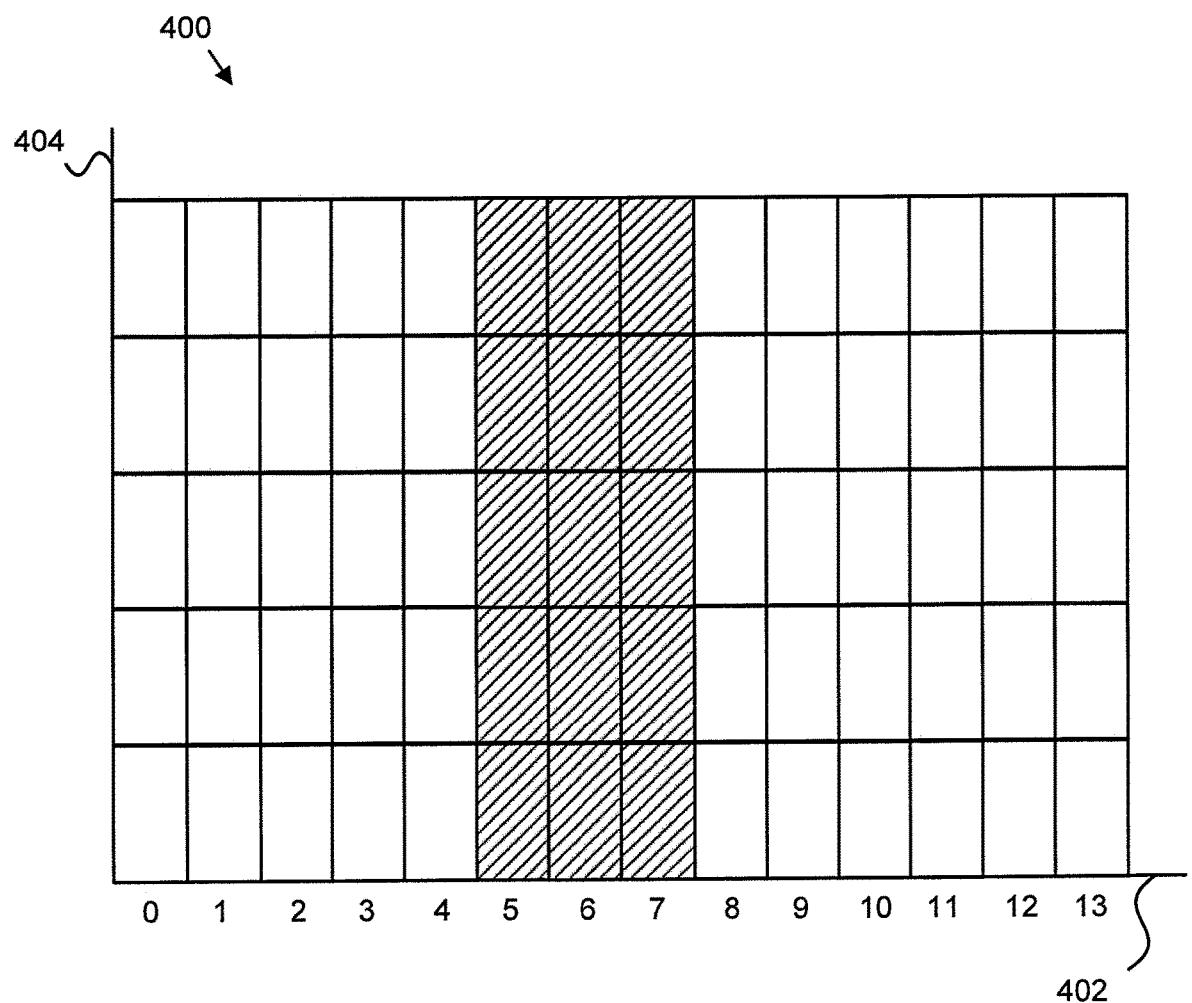
FIG. 4 is a schematic block diagram illustrating multiplexing data.

FIG. 4 is a schematic block diagram illustrating multiplexing data. As illustrated, an eMBB transmission 400 may suffer from an URLLC transmission occupying a mini-slot (e.g., the shaded OFDM symbols 5, 6, and 7). In FIG. 4, OFDM symbols (labeled 0 through 13) are illustrated over time 402 and frequency 404.

Because the URLLC transmission in mini-slot occupies a small number of consecutive OFDM symbols (e.g., 5, 6, and 7), the eMBB transmission suffers (either suffers strong interference or is punctured) only in these symbols. If these affected symbols are used to transport many consecutive coded bits (or equivalently, modulation symbols), the decoder may perform poorly, even if other coded bits are unaffected. If the affected coded bits are isolated and scattered more or less evenly, the decoder may have a good chance to decode a codeword successfully, or at least degrade gracefully according to the effective SINR of the codeword. Various embodiments described herein may apply to RE mapping both in PDSCH, and to PUSCH when OFDM is applied.

For eMBB transmissions, because puncturing may take place in only a small number of consecutive OFDM symbols in the time domain, but in a large number of consecutive PRBs in the frequency domain, mapping consecutive modulation symbols to REs in the frequency domain first may not produce the best results. Mapping consecutive modulation symbols to REs in the time domain first may avoid having multiple (12*N, where N is the number of PRBs occupied by the URLLC transmission if the same numerology is used by the eMBB and the URLLC transmission) consecutive modulation symbols punctured. However, if a codeword is mapped in the time domain linearly (in ascending or descending order), the risk of having K consecutive modulation symbols punctured occurs, where K is the length of the URLLC mini-slot. In the case of multi-layer transmission, if the modulation symbols are mapped to L layers (e.g., L <4) at a given RE before moving on to the next RE, the number of affected consecutive modulation symbols becomes K*L. As used herein, embodiments in which K is relatively small (e.g., K=1, 2, 3) are described. This is because when K is larger, many of the eMBB symbols may be punctured and it may be hard for the decoder to recover a codeword. Described herein are 1D interleavers for mapping the modulation symbols in the time domain to avoid consecutive puncturing, 2D interleavers that extends the 1D interleaver to 2D to include the time-frequency domain, and 3D interleavers that extend the 2D interleaver to 3D to include the time-frequency-spatial domain.

Figure 5:
FIG. 5 is a diagram illustrating one embodiment of a matrix for interleaving data.

FIG. 5 is a diagram illustrating one embodiment of a matrix 500 for interleaving data. Specifically, the matrix 500 for a 1D time domain interleaver is illustrated. The 1D interleaver in the time domain is used to map 2 consecutive symbols to at least K symbols apart. This can be done by filling a K' by N matrix with the consecutive integers (from 0 to M-1, where M is the number of OFDM symbols in a slot), in a row-first manner (filling a row before moving onto the next row). K' (K'>K) is a parameter chosen to inhibit puncturing of up to K consecutive OFDM symbols, N=ceiling (M/K). The integers are then read out in a column first manner (reading a column before moving to the next column). FIG. 5 illustrates an example of a matrix generated with (M, N, K), where the matrix 500 corresponds to (14, 4, 4).

Figure 6:
FIG. 6 is a diagram illustrating one embodiment of interleaving data.

FIG. 6 is a diagram illustrating one embodiment of interleaving data based on the matrix 500 of FIG. 5. After reading out the matrix of FIG. 5 in a column first manner (e.g., each column is output in order), a vector 600 is obtained. The vector 600 represents the index of the modulation symbol from the codeword that is mapped to consecutive OFDM symbols (e.g., from 0 to 13). The vector 600 may inhibit consecutive modulation symbols from being punctured by up to 3 consecutive OFDM symbols.

Figure 7:
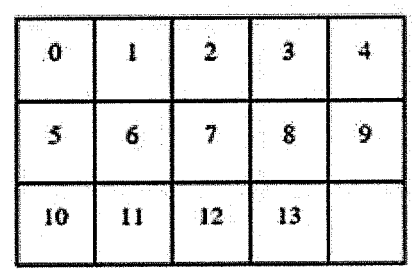
FIG. 7 is a diagram illustrating another embodiment of a matrix for interleaving data.

FIG. 7 is a diagram illustrating another embodiment of a matrix 700 for interleaving data. Specifically, the matrix 700 for another 1D time domain interleaver is illustrated. The 1D interleaver in the time domain is used to map 2 consecutive symbols to at least K symbols apart. This can be done by filling a K' by N matrix with the consecutive integers (from 0 to M-1, where M is the number of OFDM symbols in a slot), in a row-first manner (filling a row before moving onto the next row). K' (K'>K) is a parameter chosen to inhibit puncturing of up to K consecutive OFDM symbols, N=ceiling (M/K). The integers are then read out in a column first manner (reading a column before moving to the next column).

FIG. 7 illustrates an example of a matrix generated with (M, N, K), where the matrix 500 corresponds to (14, 5, 3).

Figure 8:
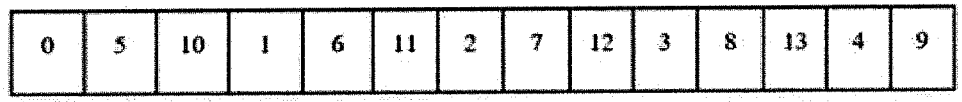
FIG. 8 is a diagram illustrating another embodiment of interleaving data.

FIG. 8 is a diagram illustrating another embodiment of interleaving data and is based on the matrix 700 of FIG. 7. After reading out the matrix of FIG. 7 in a column first manner (e.g., each column is output in order), a vector 800 is obtained. The vector 800 represents the index of the modulation symbol from the codeword that is mapped to consecutive OFDM symbols (e.g., from 0 to 13). The vector 800 may inhibit consecutive modulation symbols from being punctured by up to 3 consecutive OFDM symbols.

Sometimes not all REs may be used for PDSCH transmission. For example, some OFDM symbols may be occupied by a control channel (e.g., PDCCH in the DL), or by RS such as demodulation reference signal ("DMRS") or phase-tracking RS ("PT-RS"). Accordingly, shortened interleaving sequences may be used. Two different approaches are described herein. First, those REs not usable from the original sequence vector are punctured as illustrated in FIG. 9. Or second, use a shortened sequence in REs that are usable as illustrated in FIG. 10.

Specifically, FIG. 9 illustrates puncturing the sequence of the original length, and mapping the codeword to RE in ascending order. FIG. 9 is a diagram illustrating one embodiment of mapping data using interleaved data 900. First, a sequence, such as the sequence illustrated in FIG. 6 is used as a starting point. In this embodiment, as an example, a subset of REs are used for other purposes such as control channel (e.g., symbols 0 and 1) and RS (e.g., symbols 5, 6, 12, and 13). Symbols 0, 1, 5, 6, 12, and 13 may be punctured and only the remaining 8 symbols may be used. 8 modulation symbols (e.g., from 0 to 7) are then mapped to the remaining positions in ascending order, as illustrated by interleaved data 900 in FIG. 9.

FIG. 10 is a diagram illustrating a further embodiment of mapping data. Specifically, FIG. 10 illustrates applying a shortened interleaving sequence to usable REs to result in interleaved data 1000. As illustrated, the interleaving sequence of length 8 may generated with a generation matrix (8,3,3).

Figure 11:
FIG. 11 is a diagram illustrating an additional embodiment of interleaving data.

FIG. 11 is a diagram illustrating another embodiment of interleaving data. Specifically, FIG. 11 illustrates extending the 1D interleaving to interleaving data to a 2D (time-frequency) domain. The codeword can be mapped first in the time domain following the 1D pattern described above, before moving to the next subcarrier. The modulation symbols are mapped in a time-first manner. As illustrated in FIG. 11, the 1D interleaving sequence is extended to a 2D interleaving sequence 1200 in a PRB with 12 subcarriers and 14 symbols. The vertical dimension represents the frequency domain (subcarriers), and the horizontal dimension represents the time domain (OFDM symbols). In other words, each row represents one of the 12 subcarriers and each column represents one of 14 OFDM symbols. In the illustrated embodiment, it is assumed that all the REs in each subcarriers are usable for PDSCH/PUSCH modulation symbol mapping. If some REs are not usable, one of the embodiments described previously may be used in each subcarrier.

Figure 12:
FIG. 12 is a diagram illustrating a further embodiment of interleaving data.

FIG. 12 is a diagram illustrating a further embodiment of interleaving data and FIG. 13 is a diagram illustrating yet another embodiment of interleaving data. Specifically, FIGS. 12 and 13 illustrate extending to interleaving data to a 3D (time-frequency-spatial) domain building upon FIG. 11.

When the PDSCH/PUSCH is transmitted with multiple layers (e.g., L layers), each RE carries L modulation symbols. Various examples for apply L layers to the Res are described below.

In one embodiment, modulation symbols are mapped to the first layer following the 2D mapping pattern described in FIG. 11 until all the available REs are used, then the remaining symbols are mapped to the next layer following the same 2D mapping pattern, then any remaining layers are mapped in the same manner.

In one embodiment, the same time-frequency resources are used for the 1st layer mapping and the 2nd layer mapping. The 1st layer is illustrated by the interleaved data 1100 in FIG. 11, the 2nd layer is illustrated by interleaved data 1200 in FIG. 12.

In another embodiment, modulation symbols are mapped in the time domain for the first layer, then repeat mapping in the same subcarrier to the remaining layers. After all L layers are mapped, move on to the next subcarrier.

Using interleaved data 1300 of FIG. 13, the first two rows represent modulation symbols mapped to the same subcarrier transmitted using 2 spatial layers, the next two rows represent modulation symbols mapped to the same subcarrier transmitted using 2 spatial layers, and so forth until all 12 subcarriers are occupied by the interleaved data 1300.

In 1D, 2D and 3D mapping patterns described herein, no consecutive modulation symbols (e.g., coded bits) may be affected by puncturing or interfering from URLLC transmission in a mini-slot of up to 3 symbols. Accordingly, undesirable effects of having multiple consecutive modulation symbols of eMBB affected by URLLC may be reduced and graceful degradation of the decoder in the presence of URLLC interference may be facilitated.

Figure 14:
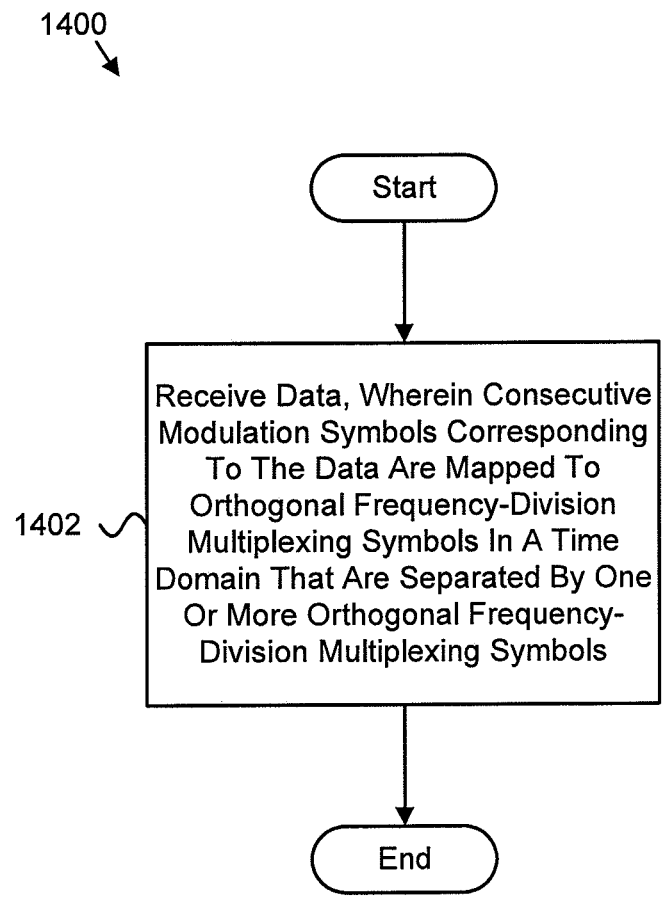
FIG. 14 is a schematic flow chart diagram illustrating one embodiment of a method for mapping data to OFDM symbols.

FIG. 14 is a schematic flow chart diagram illustrating one embodiment of a method 1400 for mapping data to OFDM symbols. In some embodiments, the method 1400 is performed by an apparatus, such as the remote unit 102. In certain embodiments, the method 1400 may be performed by a processor executing program code, for example, a microcontroller, a microprocessor, a CPU, a GPU, an auxiliary processing unit, a FPGA, or the like.

The method 1400 may include receiving 1402 data. In various embodiments, consecutive modulation symbols corresponding to the data are mapped to orthogonal frequency-division multiplexing symbols in a time domain that are separated by one or more orthogonal frequency-division multiplexing symbols.

In one embodiment, modulation symbols corresponding to the data are mapped to orthogonal frequency-division multiplexing symbols in a frequency domain. In certain embodiments, spatial layers of a resource element are not mapped to consecutive modulation symbols corresponding to the data. In various embodiments, consecutive modulation symbols corresponding to the data are mapped to orthogonal frequency-division multiplexing symbols in the time domain that are separated by two or more orthogonal frequency-division multiplexing symbols. In some embodiments, consecutive modulation symbols corresponding to the data are mapped to orthogonal frequency-division multiplexing symbols in the time domain that are separated by three or more orthogonal frequency-division multiplexing symbols.

Figure 15:
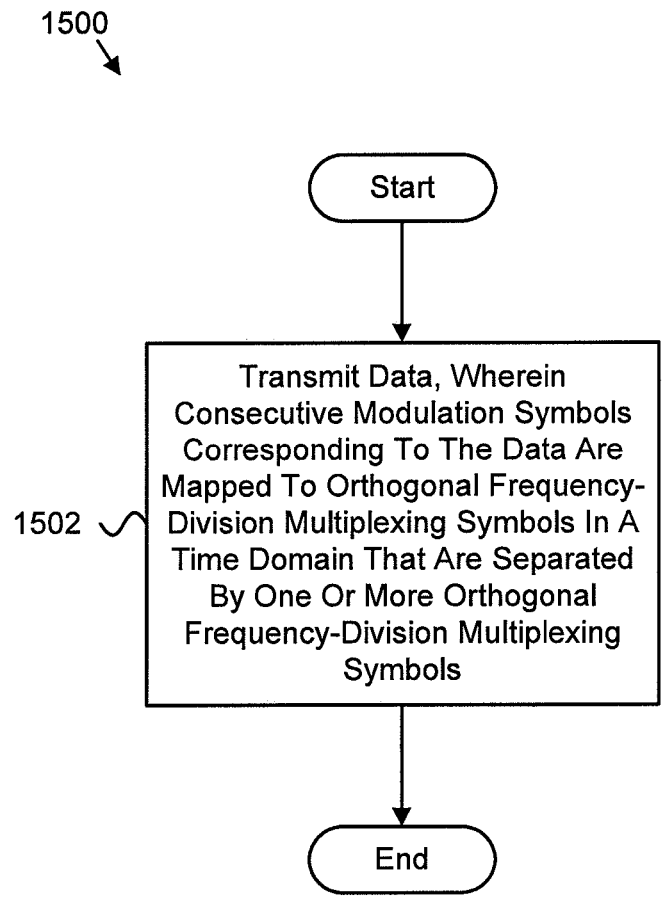
FIG. 15 is a schematic flow chart diagram illustrating another embodiment of a method for mapping data to OFDM symbols.

FIG. 15 is a schematic flow chart diagram illustrating another embodiment of a method 1500 for mapping data to OFDM symbols. In some embodiments, the method 1500 is performed by an apparatus, such as the base unit 104. In certain embodiments, the method 1500 may be performed by a processor executing program code, for example, a microcontroller, a microprocessor, a CPU, a GPU, an auxiliary processing unit, a FPGA, or the like.

The method 1500 may include transmitting 1502 data. In various embodiments, consecutive modulation symbols corresponding to the data are mapped to orthogonal frequency-division multiplexing symbols in a time domain that are separated by one or more orthogonal frequency-division multiplexing symbols.

In one embodiment, modulation symbols corresponding to the data are mapped to orthogonal frequency-division multiplexing symbols in a frequency domain. In certain embodiments, spatial layers of a resource element are not mapped to consecutive modulation symbols corresponding to the data. In various embodiments, consecutive modulation symbols corresponding to the data are mapped to orthogonal frequency-division multiplexing symbols in the time domain that are separated by two or more orthogonal frequency-division multiplexing symbols. In some embodiments, consecutive modulation symbols corresponding to the data are mapped to orthogonal frequency-division multiplexing symbols in the time domain that are separated by three or more orthogonal frequency-division multiplexing symbols.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An apparatus comprising:
a receiver that receives data, wherein consecutive modulation symbols corresponding to the data are mapped to orthogonal frequency-division multiplexing symbols in a time domain that are separated by two or more orthogonal frequency-division multiplexing symbols.

2. The apparatus of claim 1, wherein modulation symbols corresponding to the data are mapped to orthogonal frequency-division multiplexing symbols in a frequency domain.

3. The apparatus of claim 1, wherein spatial layers of a resource element are not mapped to consecutive modulation symbols corresponding to the data.

4. The apparatus of claim 1, wherein consecutive modulation symbols corresponding to the data are mapped to orthogonal frequency-division multiplexing symbols in the time domain that are separated by three or more orthogonal frequency-division multiplexing symbols.

5. A method comprising:
receiving data, wherein consecutive modulation symbols corresponding to the data are mapped to orthogonal frequency-division multiplexing symbols in a time domain that are separated by two or more orthogonal frequency-division multiplexing symbols.

6. The method of claim 5, wherein modulation symbols corresponding to the data are mapped to orthogonal frequency-division multiplexing symbols in a frequency domain.

7. The method of claim 5, wherein spatial layers of a resource element are not mapped to consecutive modulation symbols corresponding to the data.

8. The method of claim 5, wherein consecutive modulation symbols corresponding to the data are mapped to orthogonal frequency-division multiplexing symbols in the time domain that are separated by three or more orthogonal frequency-division multiplexing symbols.

9. An apparatus comprising:
a transmitter that transmits data, wherein consecutive modulation symbols corresponding to the data are mapped to orthogonal frequency-division multiplexing symbols in a time domain that are separated by two or more orthogonal frequency-division multiplexing symbols.

10. The apparatus of claim 9, wherein modulation symbols corresponding to the data are mapped to orthogonal frequency-division multiplexing symbols in a frequency domain.

11. The apparatus of claim 9, wherein spatial layers of a resource element are not mapped to consecutive modulation symbols corresponding to the data.

12. The apparatus of claim 9, wherein consecutive modulation symbols corresponding to the data are mapped to orthogonal frequency-division multiplexing symbols in the time domain that are separated by three or more orthogonal frequency-division multiplexing symbols.

13. A method comprising:
   transmitting data, wherein consecutive modulation symbols corresponding to the data are mapped to orthogonal frequency-division multiplexing symbols in a time domain that are separated by two or more orthogonal frequency-division multiplexing symbols.

14. The method of claim 13, wherein modulation symbols corresponding to the data are mapped to orthogonal frequency-division multiplexing symbols in a frequency domain.

15. The method of claim 13, wherein spatial layers of a resource element are not mapped to consecutive modulation symbols corresponding to the data.

16. The method of claim 13, wherein consecutive modulation symbols corresponding to the data are mapped to orthogonal frequency-division multiplexing symbols in the time domain that are separated by three or more orthogonal frequency-division multiplexing symbols.

* * * * *